(12) United States Patent
Nishimura et al.

(10) Patent No.: US 7,602,025 B2
(45) Date of Patent: Oct. 13, 2009

(54) HIGH VOLTAGE SEMICONDUCTOR DEVICE AND METHOD OF MANUFACTURE THEREOF

(75) Inventors: Hisaji Nishimura, Toyama (JP); Hiroyoshi Ogura, Toyama (JP); Akira Ohdaira, Toyama (JP)

(73) Assignee: Panasonic Corporation, Osaka (JP)

( * ) Notice: Subject to any disclaimer, the term of this patent is extended or adjusted under 35 U.S.C. 154(b) by 133 days.

(21) Appl. No.: 11/874,384

(22) Filed: Oct. 18, 2007

(65) Prior Publication Data

US 2008/0135971 A1 Jun. 12, 2008

(30) Foreign Application Priority Data

Dec. 8, 2006 (JP) ............................. 2006-331246

(51) Int. Cl.
*H01L 29/739* (2006.01)
*H01L 21/332* (2006.01)

(52) U.S. Cl. ................ 257/378; 257/162; 257/168; 257/E29.027; 257/E29.066

(58) Field of Classification Search ............... 257/153, 257/162, 168, 170, 172, 173, 335, 339, 341, 257/342, 343, 355, 356, 378, 409, 490, 492, 257/549, 557, 578, E29.027, E29.066, E29.197; 438/236, 311, 335, 375

See application file for complete search history.

(56) References Cited

U.S. PATENT DOCUMENTS

| 5,072,268 A * | 12/1991 | Rumennik ................ 257/378 |
| 5,925,900 A * | 7/1999 | Amaratunga et al. ......... 257/147 |
| 6,677,622 B2 * | 1/2004 | Suzuki et al. ............... 257/147 |
| 2008/0012043 A1* | 1/2008 | Udrea et al. ................ 257/163 |

FOREIGN PATENT DOCUMENTS

| EP | 371785 A2 * | 6/1990 |
| JP | 8-236754 | 9/1996 |
| JP | 3730383 | 10/2005 |

* cited by examiner

*Primary Examiner*—Sue Purvis
*Assistant Examiner*—Scott Stowe
(74) *Attorney, Agent, or Firm*—Steptoe & Johnson LLP (57) ABSTRACT

A drift diffusion layer of a low concentration is formed so as to surround a collector buffer layer having a relatively high concentration including a high-concentration collector diffusion layer in a plane structure. Thereby, current crowding in corner portions of the high-concentration collector diffusion layer is suppressed while maintaining a short turnoff time, and the improvement of breakdown voltage at on-time is realized.

17 Claims, 5 Drawing Sheets

HIGH VOLTAGE SEMICONDUCTOR DEVICE AND METHOD OF MANUFACTURE THEREOF

FIELD OF THE INVENTION

The present invention relates to a high voltage semiconductor device and a method of manufacture thereof, and more specifically to an insulated gate bipolar transistor (hereafter abbreviated as "IGBT") that realizes high breakdown voltage while maintaining a short turnoff time and a low on-voltage.

BACKGROUND OF THE INVENTION

For isolating elements in a semiconductor device, a large number of junction isolating techniques using p-n junction have been used for a long time. In recent years, however, dielectric isolation wherein in an SOI (silicon on insulator) substrate having a buried insulating film, a trench that extends from the surface of the substrate to the buried insulating film is formed, and an insulating film is formed in the trench, has been used.

Such an element structure of SOI-trench isolation is especially effective in semiconductor devices for high breakdown voltage power fields wherein the formation of deep isolation is generally required. This is because although there was disadvantage wherein the area occupied by the isolation region was large compared with the area of the element in the case of using p-n junction isolation in semiconductor devices for high breakdown voltage power fields, the use of SOI-trench isolation enables the reduction of the area of the isolation region. As a result, the areas for product chips can be reduced, and cost reduction can be expected. Furthermore, there is also advantage wherein there are no cross-talks between elements, and a plurality of high breakdown voltage power elements, which are output sections, and a plurality of low breakdown voltage elements, which are driving circuit sections thereof can be easily mounted together in the same chip.

For the above-described reasons, high breakdown voltage power elements formed on an SOI substrate have attracted attention. One of such high voltage semiconductor elements of an insulated gate type is an IGBT. The IGBT is a high voltage semiconductor element having both the high-speed switching characteristics of a power MOS transistor and the high-output characteristics of a bipolar transistor, and is widely utilized in recent years in power-electronics fields, such as driver ICs for plasma displays and switching power sources.

Figure 5:
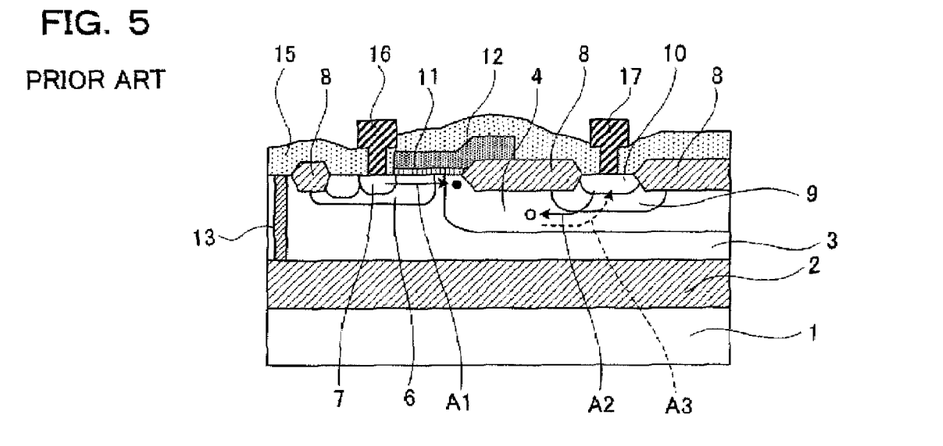
FIG. 5 is a cross-sectional structural diagram for illustrating an example of conventional high voltage semiconductor devices.

FIG. 5 is a cross-sectional structural diagram showing the element structure of an IGBT, which is a conventional high voltage semiconductor device. A low-concentration p-type silicon layer 3 (SOI active layer) is formed on a silicon substrate 1 via a buried oxide film 2. On the surface of the p-type silicon layer 3, a low-concentration n⁻-type drift (offset) diffusion layer 4 is selectively formed. In a region a little apart from the n⁻-type drift diffusion layer 4, a p-type base diffusion layer 6 is formed and on a part of the p-type base diffusion layer 6, a high-concentration n⁺-type emitter diffusion layer 7 is formed. On the surface of the n⁻-type drift diffusion layer 4, a thick LOCOS oxide film 8 is formed, and adjacent to the LOCOS oxide film 8 in the n⁻-type drift diffusion layer 4 on the opposite side of the p-type base diffusion layer 6, a p⁺-type collector diffusion layer 10 is formed. Furthermore, around the p⁺-type collector diffusion layer 10, an n⁺-type collector buffer layer 9 of a relatively high concentration is formed so as to surround the p⁺-type collector diffusion layer 10. On the silicon surfaces of the p-type base diffusion layer 6 and the p-type silicon layer 3 pinched by the high-concentration n⁺-type emitter diffusion layer 7 and the n⁻-type drift diffusion layer 4, a gate electrode 12 is provided via a gate oxide film 11. Furthermore, an isolating trench 13 for electrically isolating adjoining elements is formed in the p-type silicon layer 3. Finally, an interlayer insulating film 15, such as BPSG, is formed on the surface of the p-type silicon layer 3; an emitter electrode 16 is formed on the surface of the high-concentration n⁺-type emitter diffusion layer 7, and a collector electrode 17 is formed on the surface of the p⁺-type collector diffusion layer 10, to complete the IGBT.

The operation principle of thus formed IGBT will be described. At the turn-on time, when a positive voltage relative to the potential of the emitter electrode 16 is supplied to the gate electrode 12, a channel region on the surface of the p-type base diffusion layer 6 under the gate electrode 12 is in a conductive state, and electrons are implanted from the high-concentration n⁺-type emitter diffusion layer 7 into the n⁻-type drift diffusion layer 4 as shown by the arrow A1.

The p⁺-type collector diffusion layer 10 and the n⁺-type collector buffer layer 9 are forward-biased, and holes are implanted from the p⁺-type collector diffusion layer 10 via the n⁺-type collector buffer layer 9 into the n⁻-type drift diffusion layer 4 as shown by the arrow A2. As a result, the same number of electrons as the number of implanted holes are collected in the n⁻-type drift diffusion layer 4 to cause conductance modulation lowering resistance, and the IGBT is turned into the ON state.

On the other hand, at the turn-off time, if the voltage of the gate electrode 12 relative to the potential of the emitter electrode 16 is lowered, the channel region on the surface of the p-type base diffusion layer 6 under the gate electrode 12 becomes non-conductive, no electrons are implanted into the n⁻-type drift diffusion layer 4 from the high-concentration n⁺-type emitter diffusion layer 7, no conductance modulation is caused in the n⁻-type drift diffusion layer 4, and no current flows between the collector and the emitter. Holes remaining in the n⁺-type collector buffer layer 9 directly flow out into the p⁺-type collector diffusion layer 10 as shown by the arrow A3, and the IGBT is turned into the OFF state when flowing out is completed. The time until the holes in the n⁺-type collector buffer layer 9 disappear as described above is referred to as the "turn-off time", and determines the switching speed of the element. In order to shorten the turn-off time, if the impurity concentration of the n⁺-type collector buffer layer 9 is elevated, the quantity of holes implanted into the n⁻-type drift diffusion layer 4 from the p⁺-type collector diffusion layer 10 can be limited.

However, the high voltage lateral semiconductor device including the IGBT as described above had the following problems. In order to improve breakdown voltage in off-time of an ordinary high voltage semiconductor element, it is required to lower the impurity concentration in the n⁻-type drift diffusion layer 4. However, since the concentration of electric field mainly occurs on the surface of the n⁻-type drift diffusion layer 4 in the IGBT formed on an SOI substrate, it is important to accelerate depletion by setting a profile to lower the impurity concentration in the vicinity of the surface.

To solve such problems, in Japanese Patent Laid-Open No. 8-236754, the surface impurity concentration in the n⁻-type drift diffusion layer 4 is $1 \times 10^{14}$ to $1 \times 10^{16}$ cm$^{-3}$ and the impurity concentration in the p-type silicon layer 3 is $2 \times 10^{14}$ to $1 \times 10^{16}$ cm$^{-3}$. Specifically, the quantity of charge in the depletion layer formed in the p-n junction between the n⁻-type drift diffusion layer 4 and the p-type silicon layer 3 is balanced and depletion is accelerated to improve breakdown voltage. Here, it is easily understood that the resistance value (to elevate the impurity concentration) of the n⁻-type drift diffusion layer 4 may be lowered in order to lower the on-resistance of the high voltage semiconductor device. However, in the conventional example, although the impurity concentration of the p-type silicon layer 3 must also be elevated to maintain the balance of depletion, since the element region other than the high voltage semiconductor element is also affected, there is limitation in elevating the impurity concentration of the p-type silicon layer 3.

Figure 6:
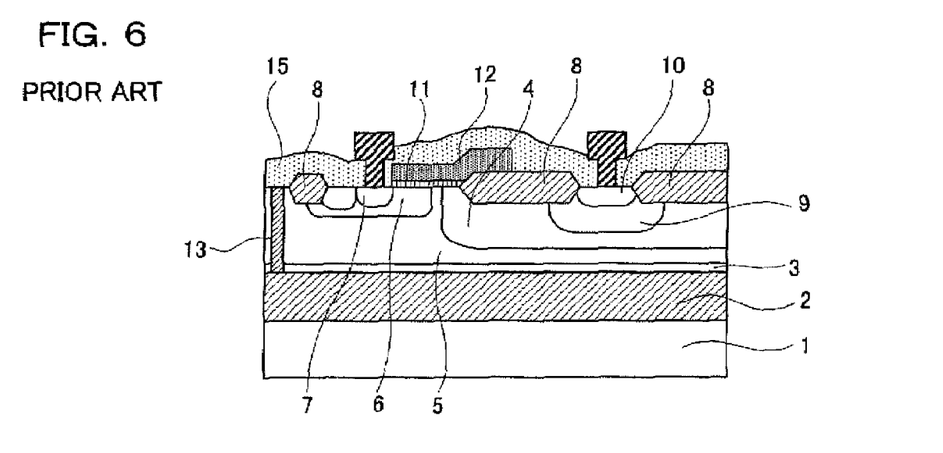
FIG. 6 is a cross-sectional structural diagram for illustrating another example of conventional high voltage semiconductor devices.

Therefore, according to the patent described in Japanese Patent No. 3730283, as shown in FIG. 6, by forming a p-type base diffusion layer 5 under the n⁻-type drift diffusion layer 4, the balance of depletion is maintained to elevate breakdown voltage while lowering the resistance of the drift layer by changing the impurity concentration of the p-type base diffusion layer 5 without changing the concentration in the p-type silicon layer 3 even if the impurity concentration of the n⁻-type drift diffusion layer 4 is elevated.

Furthermore, although an IGBT wherein an n⁺-type collector buffer layer 9 is formed adjacent to a p⁺-type collector diffusion layer 10 is shown in FIG. 6, the turn-off time is as slow as about 0.5 μsec, and slower compared with an ordinary high breakdown voltage MOS transistor. The reason is that since the dose of the n⁺-type collector buffer layer 9 is as low as 1.0 to $2.5 \times 10^{13}$ cm$^{-2}$, the collection of implanted carriers takes a long time.

In an IGBT, breakdown voltage at on-time is an important property as well as breakdown voltage at off-time. The breakdown voltage at on-time is a voltage immediately before the collector junction is broken by avalanche breakdown when a predetermined gate voltage is supplied, and the voltage of the collector is elevated while allowing on-current determined by the gate voltage to flow. Avalanche breakdown occurs in the location where current is crowded in an element, and as a result, the element may often be destroyed.

Figure 7:
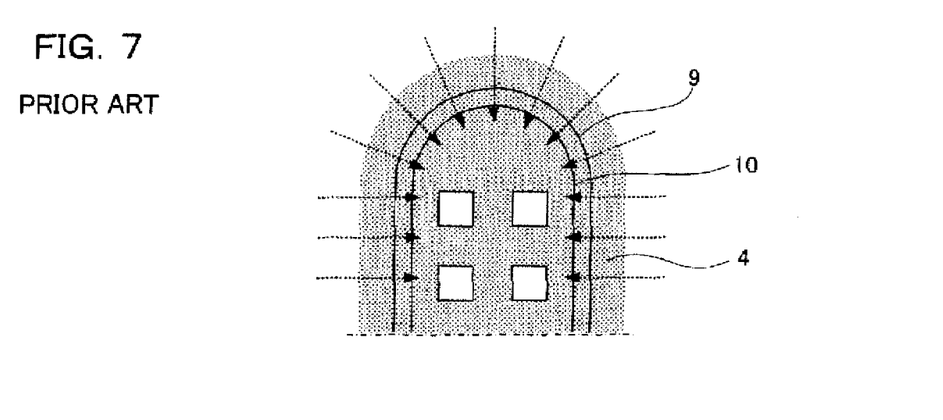
FIG. 7 is a plan structural diagram for illustrating current crowding at on-time of a conventional high voltage semiconductor device.

FIG. 7 is a plan structural diagram showing the layout of the n⁻-type drift diffusion layer 4 against the n⁺-type collector buffer layer 9 including the p⁺-type collector diffusion layer 10 shown in FIGS. 5 and 6, and illustrating current crowding at on-time. In FIG. 7, only a corner portion of the p⁺-type collector diffusion layer 10 is shown; however, an IGBT built in an actual product has an optional length (gate width) in the vertical direction, and has an equivalent corner portion in the opposite side. In the surface pattern as shown in FIG. 7, when a high voltage is supplied to the p⁺-type collector diffusion layer 10, the region where the electric field is the highest is the corner portion where the p⁺-type collector diffusion layer 10 is in a convex state. The corner portion is a portion where the flow of electrons are concentrated by a large number of carriers implanted from the high-concentration emitter diffusion layer formed around the p⁺-type collector diffusion layer 10, and is the weakest region to breakdown voltage at on-time.

DISCLOSURE OF THE INVENTION

In both of the above-described conventional techniques, the elevation of impurity concentration in the low-concentration drift diffusion layer enables the reduction of on-resistance while maintaining breakdown voltage. However, when positive bias relative to the emitter is supplied to the collector, since the collector buffer layer has relatively high impurity concentration, equipotential lines are crowded in the vicinity of the collector buffer layer, and there is possibility that breakdown voltage is insufficient in this portion. If the impurity concentration in the drift diffusion layer is elevated, the impurity concentration is generally higher in the vicinity of the surface, electric fields are further concentrated on the surface region overlapping the collector buffer layer, and there is possibility that breakdown voltage is lowered.

Here, in an IGBT, to reduce the turnoff time inferior to the turnoff time of high breakdown voltage MOS transistor, the impurity concentration of the collector buffer layer may be set to be high, and as a result, electric field is further concentrated in the vicinity of the surface where the drift diffusion layer overlaps the collector buffer layer, and lowers breakdown voltage.

To solve the above-described problems, an object of the present invention is to provide an excellent high voltage semiconductor device that can improve the breakdown voltage of an element while maintaining short turn-off time, and a method of manufacture thereof.

To achieve the above-described object, a high voltage semiconductor device according to the present invention includes a semiconductor layer of a first conductivity type joined to a semiconductor substrate via an insulating film; a drift diffusion layer of a second conductivity type formed in a predetermined region in the semiconductor layer of the first conductivity type; a base diffusion layer of the first conductivity type formed in the semiconductor layer of the first conductivity type apart from the drift diffusion layer of the second conductivity type; an emitter diffusion layer of the second conductivity type formed in the base diffusion layer of the first conductivity type; a collector buffer layer of the second conductivity type formed in the semiconductor layer of the first conductivity type on the opposite side of the base diffusion layer of the first conductivity type across the drift diffusion layer of the second conductivity type; a collector diffusion layer of the first conductivity type formed in the collector buffer layer of the second conductivity type; a gate electrode formed on the base diffusion layer of the first conductivity type at least between the emitter diffusion layer of the second conductivity type and the drift diffusion layer of the second conductivity type via a gate insulating film; and a field insulating film formed on the drift diffusion layer of the second conductivity type; wherein the drift diffusion layer of the second conductivity type is formed so as to surround the collector buffer layer of the second conductivity type; in the straight-line portion, an impurity of the second conductivity type is diffused from both of the ends to form a first overlapped region in the center, and a second overlapped region where the drift diffusion layer of the second conductivity type overlaps the collector buffer layer of the second conductivity type.

Furthermore, preferably the concentration of an impurity of the second conductivity type in the second overlapped region is lower in a corner portion than in the straight-line portion.

Furthermore, preferably the concentration of the impurity of the second conductivity type in the corner portion in the second overlapped region is lower than the concentration of the impurity in the drift diffusion layer of the second conductivity type.

Furthermore, preferably the surface concentration of the impurity of the second conductivity type in the second overlapped region is lower than the concentration of the impurity immediately under the collector buffer layer of the second conductivity type.

Furthermore, preferably the collector buffer layer of the second conductivity type is formed in a reverse convex shape, and an outside portion of the shape overlaps the drift diffusion layer of the second conductivity type.

A method of the manufacture of a high voltage semiconductor device according to the present invention includes the steps of forming a drift diffusion layer of a second conductivity type in a predetermined region in a semiconductor layer of a first conductivity type joined via an insulating film on a semiconductor substrate; performing heat treatment for diffusing the drift diffusion layer of the second conductivity type; selectively oxidizing at least the semiconductor layer of the first conductivity type on the drift diffusion layer of the second conductivity type to form a field oxide film; forming a resist pattern having openings from a region where the field oxide film adjoining the drift diffusion layer of the second conductivity type is not formed to an end of the field oxide film; implanting an impurity of the second conductivity type over the end portion of the field oxide film using the resist pattern as a mask to form a collector buffer layer of the second conductivity type; forming a base diffusion layer of the first conductivity type adjacent to the drift diffusion layer of the second conductivity type on the opposite side of the collector buffer layer of the second conductivity type; forming a gate electrode at least on a surface of the base diffusion layer of the first conductivity type via a gate oxide film; implanting an impurity of the second conductivity type into a part of the base diffusion layer of the first conductivity type using the gate electrode as a mask to form an emitter diffusion layer of a second conductivity type; and implanting an impurity of the first conductivity type into the collector buffer layer of the second conductivity type using the field oxide film as a mask; wherein the collector buffer layer of the second conductivity type is formed in a reverse convex shape, and an outside portion of the shape overlaps the drift diffusion layer of the second conductivity type.

By the high voltage semiconductor device and the method of manufacture thereof according to the present invention, since the impurity concentration in the second overlapped region in the corner portion is relatively low compared with the impurity concentration in the first overlapped region in the straight-line portion, the drift resistance component in the corner portion is relatively elevated, the current density is lowered, and current crowding is relieved. Therefore, an excellent high voltage semiconductor device that can suppress the lowering of breakdown voltage at on-time due to current crowding in the corner portion of the collector diffusion layer of the first conductivity type while maintaining a short turn-off time can be realized.

In the above-described high voltage semiconductor device, by isolating only the corner portion of the collector diffusion layer of the first conductivity type where current crowding easily occurs at on-time by an optional distance between the collector buffer layer of the second conductivity type and the low-concentration drift diffusion layer of the second conductivity type, current crowding is further relieved, and the lowering of breakdown voltage at on-time can also be suppressed.

Furthermore, in the IGBT, to limit the implantation of carriers from the collector diffusion layer of the first conductivity type, the collector buffer layer of the second conductivity type is formed so as to surround the collector diffusion layer of the first conductivity type. The impurity concentration of the collector buffer layer of the second conductivity type contacting the collector diffusion layer of the first conductivity type is set to be low so as to suppress current crowding on the surface, and immediately under the collector diffusion layer of the first conductivity type, the impurity concentration is set to be relatively high. As a result, the implantation of carriers from the collector diffusion layer of the first conductivity type can be controlled, and the turn-off time can be shortened.

In conventional examples, the drift diffusion layer wherein a current flows is formed on the surface, and since the peak of impurity concentration is in the vicinity of the surface, the current flows in the vicinity of the surface. It is considered that electric fields are also concentrated in the vicinity of the surface, and thus if the concentration of the drift diffusion layer is elevated, breakdown voltage at off-time is also lowered. However in the present invention, such defects can be avoided. In the invention described in Japanese Patent No. 3730283, although application to IGBT is also proposed, the dose in the collector buffer layer of the second conductivity type is $10 \times 10^{13}$ to $2.5 \times 10^{13}$ cm$^{-2}$, and the turnoff time is about 0.5 μsec. On the other hand in the present invention, since the impurity concentration on the surface can be suppressed to be low to relieve current crowding, the dose can be set to be higher than the dose in the invention described in Japanese Patent No. 3730283. As a result, the turnoff time can be shortened.

DESCRIPTION OF THE EMBODIMENTS

Embodiments of the present invention will be described referring to the drawings. In the drawings, the components having substantially same functions will be denoted by the same reference numerals and characters for simplifying the description.

First Embodiment

An IGBT, which is a high voltage semiconductor device according to a first embodiment of the present invention, will be described referring to the drawings.

Figure 1A:
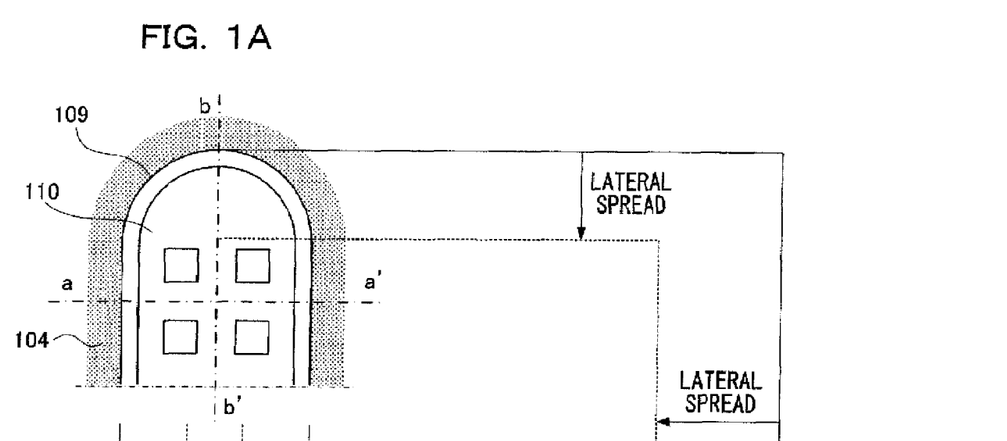
FIG. 1A is a plan structural diagram of an IGBT, which is a high voltage semiconductor device according to a first embodiment of the present invention.
Figure 1B:
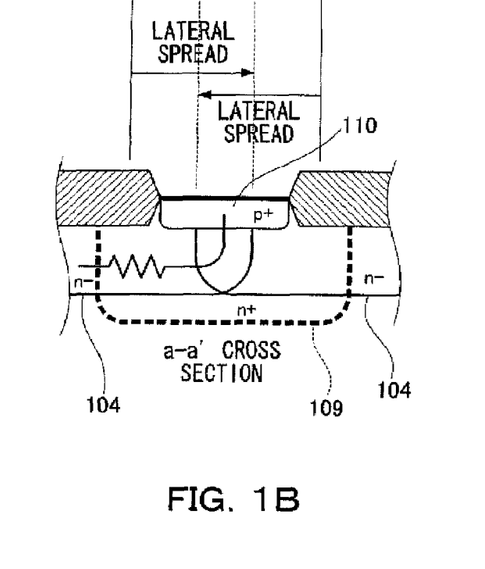
FIG. 1B is a cross-sectional structural diagram of the IGBT, which is the high voltage semiconductor device according to the first embodiment of the present invention.
Figure 1C:
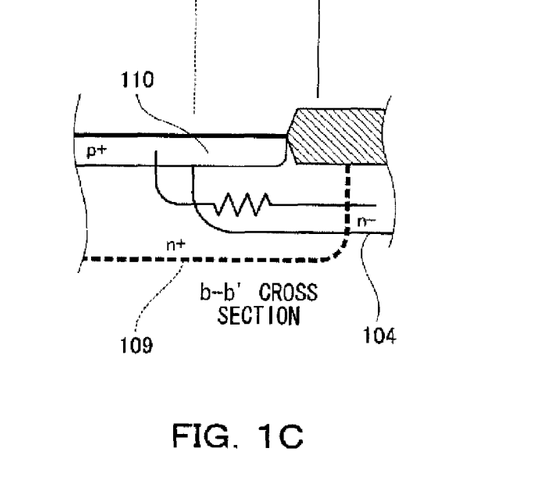
FIG. 1C is a cross-sectional structural diagram of the IGBT, which is the high voltage semiconductor device according to the first embodiment of the present invention.

FIG. 1A is a plan structural diagram illustrating that an n$^+$-type collector buffer layer 109 is formed on a p-type silicon layer 103 adjacent to an n$^-$-type drift diffusion layer 104 in the IGBT of the present invention. FIGS. 1B and 1C are cross-sectional structural diagrams along the line a-a' and the line b-b' in FIG. 1A, respectively.

The present invention differs from the conventional examples in that in the conventional examples, an n-type drift diffusion layer 104 is formed so as to completely include the region of an n$^+$-type collector buffer layer 109, whereas in the IGBT of the present invention shown in FIGS. 1A to 1C, an n$^-$-type drift diffusion layer 104 is formed so as to surround the n$^+$-type collector buffer layer 109. Since other structures are basically identical to those in the conventional example shown in FIG. 5, description referring to the drawings will be omitted.

As shown in FIG. 1B, the n$^-$-type drift diffusion layer 104 is formed by predetermined heat treatment so as to overlap the n$^+$-type collector buffer layer 109 by lateral spread toward the n$^+$-type collector buffer layer 109 side. Of course, the n$^+$-type collector buffer layer 109 is also laterally spread. At this time, in the end portions of the p$^+$-type collector diffusion layer 110 in the potential transferring direction (straight-line portion in the drawing, hereafter referred to as "straight-line portion", in FIG. 1B being the cross-sectional view in the a-a' direction in FIG. 1A), since an impurity is diffused from both of the ends of the region of the n$^-$-type drift diffusion layer 104, overlapping each other occurs in the vicinity of the center. While in the corner portions (in FIG. 1C being the cross-sectional view in the b-b' direction in FIG. 1A), no overlapping region is formed. Therefore, since the impurity concentration in the corner portions is relatively low compared with the straight-line portion of the p$^+$-type collector diffusion layer 110, the drift resistor component in the corner portions becomes relatively high and the current density is lowered to relieve current crowding.

In addition, in the n$^+$-type collector buffer layer 109 immediately under the p$^+$-type collector diffusion layer 110, the impurity in a quantity of ideally at least $1.0 \times 10^{14}$ cm$^{-3}$ is implanted, and the impurity concentration in the n$^+$-type collector buffer layer 109 immediately under the p$^+$-type collector diffusion layer 110 reaches about $1.0 \times 10^{18}$ cm$^{-3}$. Therefore, the turn-off time of the IGBT is mostly determined by the impurity concentration in this region.

As described above, according to the first embodiment of the present invention, an excellent high voltage semiconductor device that can suppress the lowering of breakdown voltage at on-time by current crowding in the corner portions of the p$^+$-type collector diffusion layer 110 while maintaining short turnoff time. As a result, the turnoff time of the IGBT can be shortened to about 100 nsec while improving the breakdown voltage.

In the first embodiment, although the n$^+$-type collector buffer layer contacts the region to define the n$^-$-type drift diffusion layer, the distance between them can be optionally determined. Specifically, since the impurity concentration in the overlapped region can be adjusted by lateral spread due to heat treatment in the manufacturing process, the distance between the collector and the emitter can be set depending on the guarantee breakdown voltage of the element.

Second Embodiment

Next, an IGBT, which is a high voltage semiconductor device according to a second embodiment of the present invention, will be described referring to the drawings.

Figure 2A:
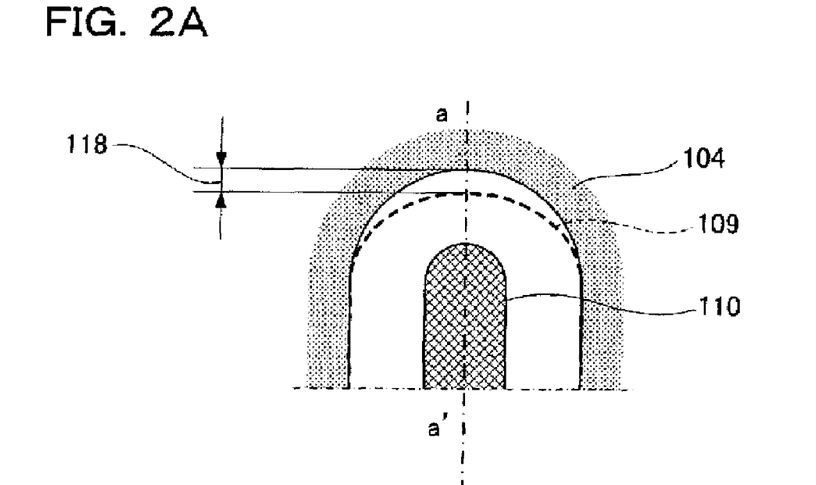
FIG. 2A is a plan structural diagram of an IGBT, which is a high voltage semiconductor device according to a second embodiment of the present invention.
Figure 2B:
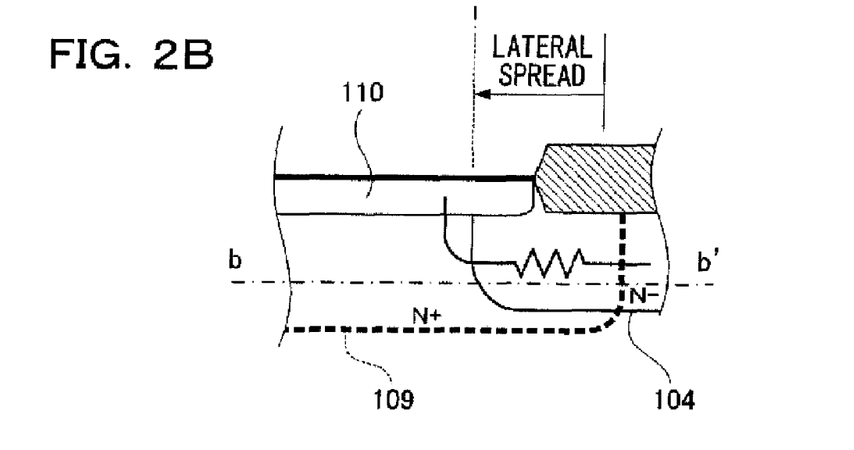
FIG. 2B is a cross-sectional structural diagram of the IGBT, which is the high voltage semiconductor device according to the second embodiment of the present invention.

FIG. 2A is a plan structural diagram of an IGBT, which is the high voltage semiconductor device according to the second embodiment of the present invention; FIG. 2B is a cross-sectional structural diagram along the line a-a' in FIG. 2A; and FIG. 2C is a graph showing an impurity concentration profile of the n$^+$-type collector buffer layer 109 and the n$^-$-type drift diffusion layer 104 in the vicinity of the line b-b' in FIG. 2B.

The IGBT in the second embodiment has a structure and components identical to those of the IGBT in the first embodiment shown in FIGS. 1A and 1B except the location of the n$^-$-type drift diffusion layer 104 relative to the p$^+$-type collector diffusion layer 110 and the n$^+$-type collector buffer layer 109. Therefore, the description for the same components will be omitted by using the same reference numerals and characters in FIGS. 2A to 2C as in FIGS. 1A to 1C, and only the difference will be described in detail.

In the first embodiment, the regions defining the n$^-$-type drift diffusion layer 104 and the n$^+$-type collector buffer layer 109 were adjacent to each other at an optional distance. In the second embodiment, however, as shown in FIG. 2A, a distance between the n$^-$-type drift diffusion layer 104 and the n$^+$-type collector buffer layer 109 is lengthened in the corner portions compared with the straight-line portion of the p$^+$-type collector diffusion layer 110 to adjust the drift resistance in the corner portions. Ideally, the distance 118 between the n$^-$-type drift diffusion layer 104 and the n$^+$-type collector buffer layer 109 is set to be 0.5 to 1.0 μm, and as shown in FIG. 2B, an overlapped region is formed using the lateral spread of the diffusion layer in drive-in conducted after defining the region for the diffusion layer.

Figure 2C:
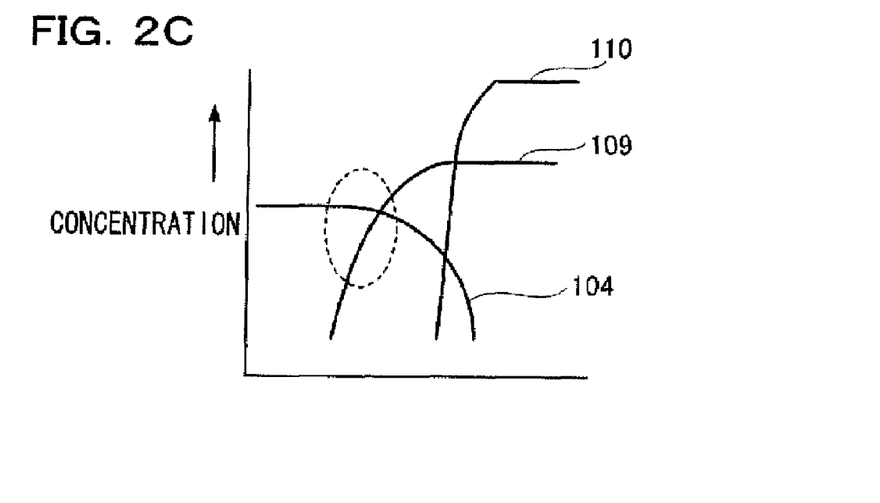
FIG. 2C is a graph showing an impurity concentration profile of the IGBT, which is the high voltage semiconductor device according to the second embodiment of the present invention.

In the present invention, as shown in the dotted-line circle in the impurity concentration profile of FIG. 2C, the impurity concentration in the overlapped region of the n$^-$-type drift diffusion layer 104 and the n$^+$-type collector buffer layer 109 is set to be lower than the impurity concentration in the n$^-$-type drift diffusion layer 104. For example, when the peak impurity concentration in the bulk of the n$^-$-type drift diffusion layer 104 is $1 \times 10^{16}$ cm$^3$ the impurity concentration in the overlapped region is accordingly lower than $1 \times 10^{16}$ cm$^{-3}$. Therefore, the straight-line portion that determines the on-voltage (drift resistance) is not affected, and current crowding in the corner portions can be suppressed.

According to the second embodiment, as described above, drift resistance in the overlapped region of the n$^+$-type collector buffer layer 109 and the n$^-$-type drift diffusion layer 104 can be optionally adjusted only in the corner portions of the p$^+$-type collector diffusion layer 110. As a result, in addition to the effect obtained in the first embodiment, the lowering of breakdown voltage at on-time can be further suppressed, and an excellent high voltage semiconductor device having high breakdown voltage can be realized.

Third Embodiment

Next, an IGBT, which is a high voltage semiconductor device according to a third embodiment of the present invention, will be described referring to the drawings.

Figure 3A:
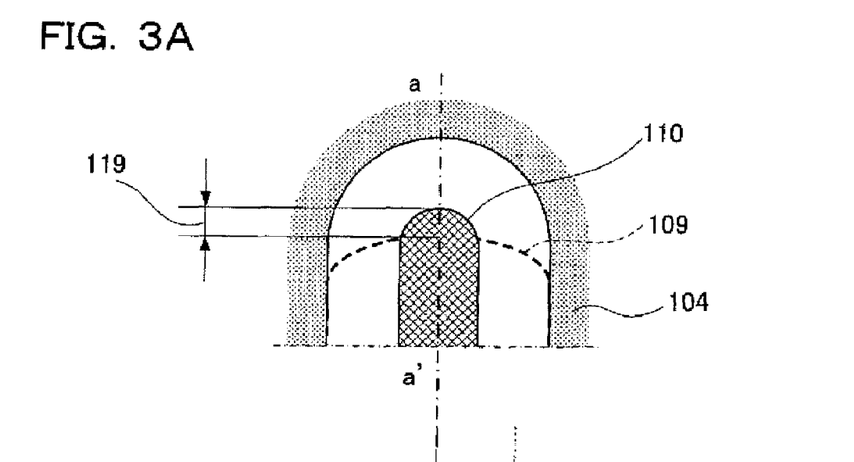
FIG. 3A is a plan structural diagram of an IGBT, which is a high voltage semiconductor device according to a third embodiment of the present invention.
Figure 3B:
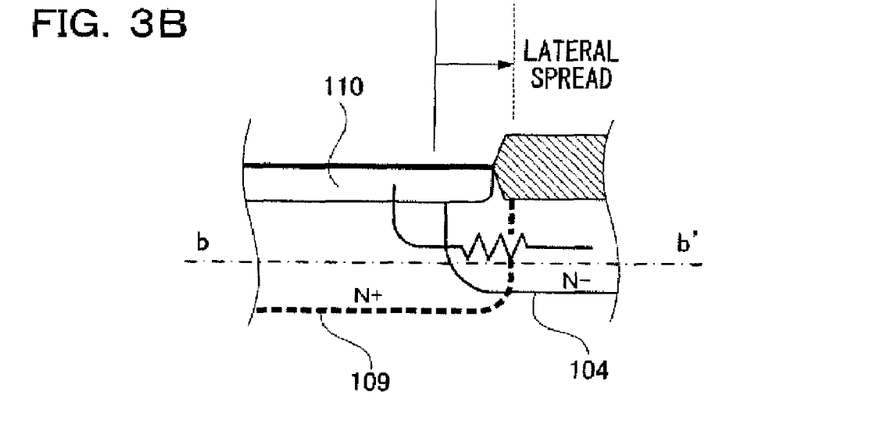
FIG. 3B is a cross-sectional structural diagram of the IGBT, which is the high voltage semiconductor device according to the third embodiment of the present invention.
Figure 3C:
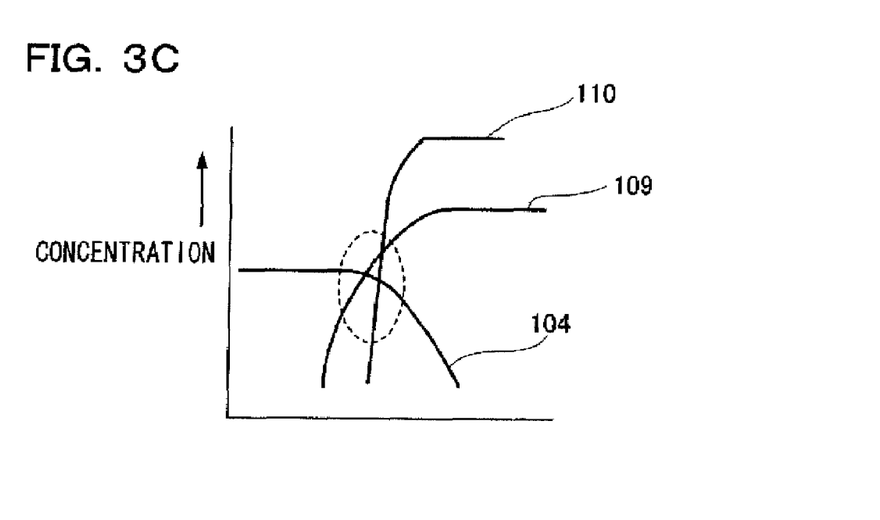
FIG. 3C is a graph showing an impurity concentration profile of the IGBT, which is the high voltage semiconductor device according to the third embodiment of the present invention.

FIG. 3A is a plan structural diagram of the IGBT, which is the high voltage semiconductor device according to the third embodiment of the present invention; FIG. 3B is a cross-sectional structural diagram along the line a-a' in FIG. 3A; and FIG. 3C is a graph showing an impurity concentration profile of the $n^+$-type collector buffer layer 109 and the $n^-$-type drift diffusion layer 104 in the vicinity of the line b-b' in FIG. 3B.

The IGBT in the third embodiment has a structure and components identical to those of IGBTs in the first and second embodiments shown in FIGS. 1 and 2 except the location of the $n^+$-type collector buffer layer 109 relative to the $p^+$-type collector diffusion layer 110. Therefore, the description for the same components will be omitted by using the same reference numerals and characters in FIGS. 3A to 3C as in FIGS. 1A to 1C and 2A to 2C, and only the difference will be described in detail.

In the plan structural diagrams of IGBTs shown in FIGS. 1A and 2A, the regions of $p^+$-type collector diffusion layer 110 are defined inside the $n^+$-type collector buffer layers 109. On the other hand, in FIG. 3A, the region for defining the $n^+$-type collector buffer layer 109 is designed so that only the corner portions of the straight-line portion of the $p^+$-type collector diffusion layer 110 are inside the $p^+$-type collector diffusion layer 110. Actually, a plane distance between the $n^+$-type collector buffer layer 109 and the $p^+$-type collector diffusion layer 110 (hereafter referred to as "margin") 119 is preferably 0.5 to 2.0 μm, and set to be inside the $p^+$-type collector diffusion layer 110.

Thereby, as shown in FIG. 3B, the $p^+$-type collector diffusion layer 110 is surrounded by lateral spread in drive-in performed after defining the region of the $n^+$-type collector buffer layer 109. Thereby, as shown in the dotted circle in FIG. 3C, the surface concentration of the $n^+$-type collector buffer layer 109 around the $p^+$-type collector diffusion layer 110 can be lowered to be one-tenth the impurity concentration immediately under the $p^+$-type collector diffusion layer 110.

Thus, according to the third embodiment, in the same manner as the effects obtained by the first and second embodiments, the drift resistance in the overlapped region of the $n^+$-type collector buffer layer 109 and the $n^-$-type drift diffusion layer 104 can be optionally adjusted only in the corner portions of the $p^+$-type collector diffusion layer 110. In addition, the impurity concentration in the $n^+$-type collector buffer layer 109 immediately under the $p^+$-type collector diffusion layer 110 can be maintained high. Therefore, the turnoff time can be further reduced.

Since the $n^+$-type collector buffer layer 109 has a high impurity concentration and a relatively large lateral spread, the distance between the collector and the emitter is long. However, according to the third embodiment of the present invention, the effect to shorten the plane distance defining the $n^+$-type collector buffer layer 109 can be obtained.

Furthermore, according to the third embodiment of the present invention, the impurity concentration of the $n^+$-type collector buffer layer 109 is set to be as relatively high as about $1 \times 10^{18}$ cm$^{-3}$ immediately under the $p^+$-type collector diffusion layer 110, and about one-tenth lower as about $1 \times 10^{17}$ cm$^{-3}$ around the $p^+$-type collector diffusion layer 110. Therefore, no lowering of breakdown voltage due to current crowding occurs in the corner portions of the $p^+$-type collector diffusion layer 110.

As described above, according to the third embodiment of the present invention, in addition to the effects of the first and second embodiments, shorter turn-off time can be realized, and an excellent high voltage semiconductor device that can prevent the lowering of breakdown voltage at on-time due to current crowding and can reduce the element size can be realized.

In the third embodiment, although the region of the $p^+$-type collector diffusion layer 110 in only the corner portions of the $p^+$-type collector diffusion layer 110 is positioned inside the $n^+$-type collector buffer layers 109, this can also be applied to the straight-line portion. In this case, however, the margin 119 of the $n^+$-type collector buffer layers 109 and the $p^+$-type collector diffusion layer 110 in the corner portions must be longer than in the straight-line portion. Thereby, in addition to the vertical direction in the plan structural diagram shown in FIG. 3A, the plane distance in the lateral direction can also be reduced.

However, if the margin 119 of the corner portions is excessively long, there is possibility that the depletion layer extending from the p-type base diffusion layer reaches the $p^+$-type collector diffusion layer 110 to cause punch-through lowering breakdown voltage. Therefore, it is preferable to set the impurity concentration in the bulk of the region where the $n^-$-type drift diffusion layer 104 overlaps the $n^+$-type collector buffer layer 109 to be equal to or higher than the impurity concentration in the n-type drift diffusion layer 104.

Fourth Embodiment

Next, a method of manufacture of an IGBT, which is a high voltage semiconductor device according to a fourth embodiment of the present invention, will be described referring to the drawings.

FIGS. 4A to 4D are cross-sectional views for illustrating a method of manufacture of the IGBT according to the fourth embodiment of the present invention.

Figure 4A:
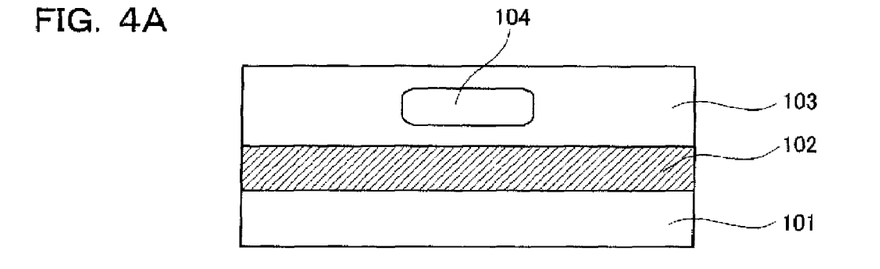
FIG. 4A is a step-by-step cross-sectional structural diagram showing a method of manufacture of an IGBT, which is a high voltage semiconductor device according to a fourth embodiment of the present invention.

As shown in FIG. 4A, the IGBT is formed using an SOI substrate composed of a silicon substrate 101, a buried oxide film 102, and a p-type silicon layer 103 (SOI active layer). A relatively thick resist film having a thickness of about 3 to 5 μm is applied onto the surface of the p-type silicon layer 103 in the SOI substrate, and a resist pattern (not shown) is formed in an optional region. By ion implantation of an n-type impurity at high energy using the formed resist pattern as a mask, an $n^-$-type drift diffusion layer 104 is formed. For example, phosphorus is used as the n-type impurity, the dose is about $1 \times 10^{12}$ to $1 \times 10^{13}$ cm$^{-2}$, and the accelerating energy is about 0.5 to 3 MeV.

Figure 4B:
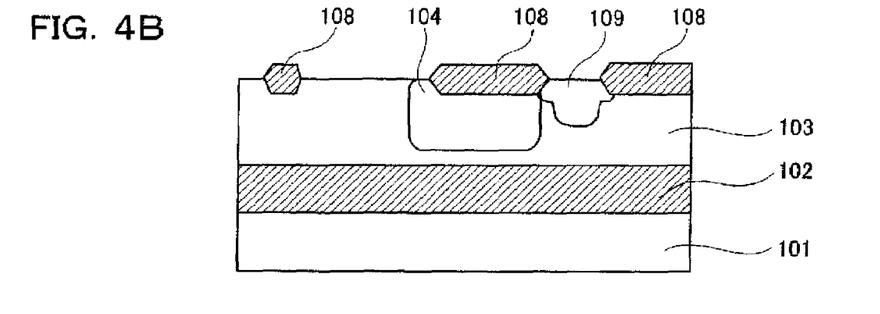
FIG. 4B is a step-by-step cross-sectional structural diagram showing the method of manufacture of the IGBT, which is the high voltage semiconductor device according to the fourth embodiment of the present invention.

Next, as shown in FIG. 4B, after removing the resist, a high-temperature heat treatment of at least 1100° C. is performed in a nitrogen atmosphere to form an $n^-$-type drift diffusion layer 104 having a profile of impurity concentration as described in the first embodiment. Next, an LOCOS oxide film 108 having a thickness of about 500 nm is formed in an optional region on the p-type silicon layer 103 on the $n^-$-type drift diffusion layer 104. Next, an $n^+$-type collector buffer layer 109 having a relatively high concentration is formed by ion implantation adjacent to the n-type drift diffusion layer 104 in a region where the LOCOS oxide film 108 is not formed. At this time, in a region defining the $n^+$-type collector buffer layer 109, a resist pattern (not shown) is formed on the LOCOS oxide film 108 so as to have an opening portion from the region where the LOCOS oxide film 108 is not formed to the end portion of the LOCOS oxide film 108, and ions are implanted. Phosphorus is used as the n-type impurity, the dose is about $1\times10^{14}$ to $5\times10^{14}$ cm$^{-2}$, and the accelerating energy is set to about 200 to 500 keV so that the ion implantation range comes in the LOCOS oxide film 108. Thereby, difference in the implantation depth of the n$^+$-type collector buffer layer 109 and the surface impurity concentration is produced between the p-type silicon layer 103 and the thin film region of the bird's beak portion in the opening portion of the resist. Thereby, the impurity concentration in the vicinity of the surface where the n$^+$-type collector buffer layer 109 overlaps the n$^-$-type drift diffusion layer 104 can be suppressed to be low, and the impurity concentration in the bulk can be of a reverse convex shape consisting of a profile of about $1\times10^{18}$ cm$^{-3}$.

Figure 4C:
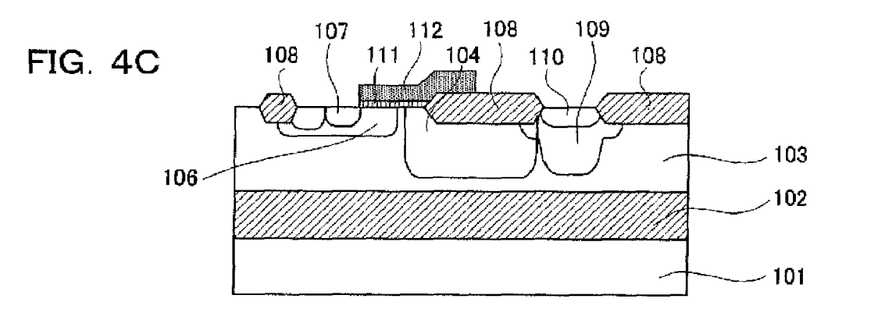
FIG. 4C is a step-by-step cross-sectional structural diagram showing the method of manufacture of the IGBT, which is the high voltage semiconductor device according to the fourth embodiment of the present invention.

Next, as shown in FIG. 4C, for example, about $1\times10^{12}$ to $1\times10^{13}$ cm$^{-2}$ of boron ions are implanted in the p-type base diffusion layer 106 apart from the n$^-$-type drift diffusion layer 104 in the opposite side of the n$^+$-type collector buffer layer 109. Then, a gate electrode 112 is formed via a gate oxide film 111 of a thickness of about 20 to 50 nm by thermal oxidation on the silicon surface of the p-type base diffusion layer 106 and the p-type silicon layer 103. Furthermore, an n$^+$-type emitter diffusion layer 107 of a high concentration is formed on a part of the surface of the p-type base diffusion layer 106, and a p$^+$-type collector diffusion layer 110 of a high concentration is formed inside the n$^+$-type collector buffer layer 109.

Figure 4D:
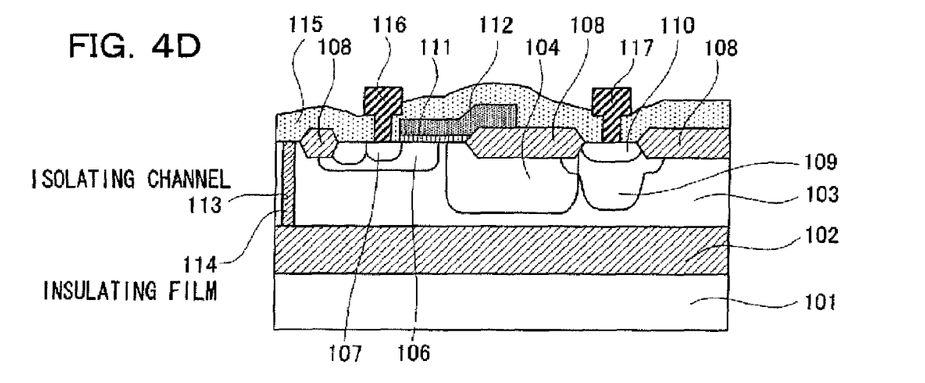
FIG. 4D is a step-by-step cross-sectional structural diagram showing the method of manufacture of the IGBT, which is the high voltage semiconductor device according to the fourth embodiment of the present invention.

Thereafter, as shown in FIG. 4D, an isolating channel 113 for electrically isolating adjoining elements is formed by etching the p-type silicon layer 103 by RIE and the like, and the isolating channel 113 is filled with an insulating film 114. An interlayer insulating film 115, such as a BPSG film, is formed on the surface of the p-type silicon layer 103 so as to coat the gate electrode 112, the LOCOS oxide film 108 and the like, and an emitter electrode 116 and a collector electrode 117 to connect to the high-concentration n$^+$-type emitter diffusion layer 107 and the p$^+$-type collector diffusion layer 110 are formed on the interlayer insulating film 115 using a metal material such as aluminum.

According to the method of manufacture of the high voltage semiconductor device in the fourth embodiment of the present invention, as described above, the impurity concentration on the surface of the n$^+$-type collector buffer layer 109, specifically, the impurity concentration around the p$^+$-type collector diffusion layer 110 is lowered even on the surface because ion implantation is shielded by the bird's beak portion of the LOCOS oxide film 108 and diffusion depth is reduced. On the other hand, the structure is designed so that the peak of the impurity profile of phosphorus is positioned immediately under the p$^+$-type collector diffusion layer 110. By such a structure, since turn-off time by carriers implanted from the p$^+$-type collector diffusion layer 110 can be set to be short, and the surface concentration of the n$^+$-type collector buffer layer 109 can be suppressed to be low, an excellent high voltage semiconductor device wherein the lowering of breakdown voltage due to current crowding on the surface does not occur can be realized.

In the high voltage semiconductor device and the method of manufacture thereof, since the impurity profile in the n$^-$-type drift diffusion layer 104 is designed to have the peak in the bulk, the current crowding on the surface can be prevented, and since the current path at on-time can be formed in the bulk, the effect to suppress the on-voltage of the IGBT to be low can also be obtained.

Although preferable examples of the present invention were described above, the present invention is not limited to the configurations in the above-described embodiments, but various modifications are feasible, and the dimensions and shapes of diffusion layers and regions defining the semiconductor device can be modified without deviating from the concept and technical scope of the present invention.

What is claimed is:

1. A high voltage semiconductor device comprising:
    a semiconductor layer of a first conductivity type joined to a semiconductor substrate via an insulating film;
    a drift diffusion layer of a second conductivity type formed in a predetermined region in said semiconductor layer of the first conductivity type;
    a base diffusion layer of the first conductivity type formed in said semiconductor layer of the first conductivity type apart from said drift diffusion layer of the second conductivity type;
    an emitter diffusion layer of the second conductivity type formed in said base diffusion layer of the first conductivity type;
    a collector buffer layer of the second conductivity type formed in said semiconductor layer of the first conductivity type on the opposite side of said base diffusion layer of the first conductivity type across said drift diffusion layer of the second conductivity type;
    a collector diffusion layer of the first conductivity type formed in said collector buffer layer of the second conductivity type;
    a gate electrode formed on said base diffusion layer of the first conductivity type at least between said emitter diffusion layer of the second conductivity type and said drift diffusion layer of the second conductivity type via a gate insulating film; and
    a field insulating film formed on said drift diffusion layer of the second conductivity type; wherein
    said drift diffusion layer of the second conductivity type is formed so as to surround said collector buffer layer of the second conductivity type; in a straight-line portion, which is an end portion of said collector diffusion layer of the first conductivity type in a potential transferring direction, an impurity of the second conductivity type is diffused from both of the ends to form a first overlapped region in the center, and a second overlapped region where said drift diffusion layer of the second conductivity type overlaps said collector buffer layer of the second conductivity type.

2. The high voltage semiconductor device according to claim 1, wherein the concentration of an impurity of the second conductivity type in said second overlapped region is lower in a corner portion than in the straight-line portion.

3. The high voltage semiconductor device according to claim 1, wherein the concentration of the impurity of the second conductivity type in the corner portion in said second overlapped region is lower than the concentration of the impurity in said drift diffusion layer of the second conductivity type.

4. The high voltage semiconductor device according to claim 2, wherein the concentration of the impurity of the second conductivity type in the corner portion in said second overlapped region is lower than the concentration of the impurity in said drift diffusion layer of the second conductivity type.

5. The high voltage semiconductor device according to claim 1, wherein the surface concentration of the impurity of the second conductivity type in said second overlapped region is lower than the concentration of the impurity in said collector buffer layer of the second conductivity type located immediately under said collector diffusion layer of the first conductivity type.

6. The high voltage semiconductor device according to claim 2, wherein the surface concentration of the impurity of the second conductivity type in said second overlapped region is lower than the concentration of the impurity in said collector buffer layer of the second conductivity type located immediately under said collector diffusion layer of the first conductivity type.

7. The high voltage semiconductor device according to claim 3, wherein the surface concentration of the impurity of the second conductivity type in said second overlapped region is lower than the concentration of the impurity in said collector buffer layer of the second conductivity type located immediately under said collector diffusion layer of the first conductivity type.

8. The high voltage semiconductor device according to claim 4, wherein the surface concentration of the impurity of the second conductivity type in said second overlapped region is lower than the concentration of the impurity in said collector buffer layer of the second conductivity type located immediately under said collector diffusion layer of the first conductivity type.

9. The high voltage semiconductor device according to claim 1, wherein said collector buffer layer of the second conductivity type is formed in a reverse convex shape, and an outside portion of said shape overlaps said drift diffusion layer of the second conductivity type.

10. The high voltage semiconductor device according to claim 2, wherein said collector buffer layer of the second conductivity type is formed in a reverse convex shape, and the outside portion of said shape overlaps said drift diffusion layer of the second conductivity type.

11. The high voltage semiconductor device according to claim 3, wherein said collector buffer layer of the second conductivity type is formed in a reverse convex shape, and the outside portion of said shape overlaps said drift diffusion layer of the second conductivity type.

12. The high voltage semiconductor device according to claim 4, wherein said collector buffer layer of the second conductivity type is formed in a reverse convex shape, and the outside portion of said shape overlaps said drift diffusion layer of the second conductivity type.

13. The high voltage semiconductor device according to claim 5, wherein said collector buffer layer of the second conductivity type is formed in a reverse convex shape, and the outside portion of said shape overlaps said drift diffusion layer of the second conductivity type.

14. The high voltage semiconductor device according to claim 6, wherein said collector buffer layer of the second conductivity type is formed in a reverse convex shape, and the outside portion of said shape overlaps said drift diffusion layer of the second conductivity type.

15. The high voltage semiconductor device according to claim 7, wherein said collector buffer layer of the second conductivity type is formed in a reverse convex shape, and the outside portion of said shape overlaps said drift diffusion layer of the second conductivity type.

16. The high voltage semiconductor device according to claim 8, wherein said collector buffer layer of the second conductivity type is formed in a reverse convex shape, and the outside portion of said shape overlaps said drift diffusion layer of the second conductivity type.

17. A method of manufacture of a high voltage semiconductor device comprising the steps of:
forming a drift diffusion layer of a second conductivity type in a predetermined region in a semiconductor layer of a first conductivity type joined via an insulating film on a semiconductor substrate;
performing heat treatment for diffusing said drift diffusion layer of the second conductivity type;
selectively oxidizing at least said semiconductor layer of the first conductivity type on said drift diffusion layer of the second conductivity type to form a field oxide film;
forming a resist pattern having openings in a region between said field oxide film adjoining said drift diffusion layer of the second conductivity type and adjoining said field oxide film;
implanting an impurity of the second conductivity type over an end portion of said field oxide film using said resist pattern as a mask to form a collector buffer layer of the second conductivity type;
forming a base diffusion layer of the first conductivity type adjacent to said drift diffusion layer of the second conductivity type on the opposite side of said collector buffer layer of the second conductivity type;
forming a gate electrode at least on a surface of said base diffusion layer of the first conductivity type via a gate oxide film;
implanting an impurity of the second conductivity type into a part of said base diffusion layer of the first conductivity type using said gate electrode as a mask to form an emitter diffusion layer of the second conductivity type; and
implanting an impurity of the first conductivity type into said collector buffer layer of the second conductivity type using said field oxide film as a mask to form a collector diffusion layer of the first conductivity type; wherein
said collector buffer layer of the second conductivity type is formed in a reverse convex shape, and an outside portion of said shape overlaps said drift diffusion layer of the second conductivity type.

\* \* \* \* \*